US009583208B2

(12) United States Patent
Taneja et al.

(10) Patent No.: US 9,583,208 B2
(45) Date of Patent: Feb. 28, 2017

(54) SENSING SCHEME FOR HIGH SPEED MEMORY CIRCUITS WITH SINGLE ENDED SENSING

(71) Applicant: Synopsys, Inc., Mountain View, CA (US)

(72) Inventors: Sachin Taneja, New Delhi (IN); Vaibhav Verma, Haryana (IN); Pritender Singh, Uttar Pradesh (IN); Sanjeev Kumar Jain, Ghaziabad (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/801,837

(22) Filed: Jul. 17, 2015

(65) Prior Publication Data

US 2016/0336076 A1 Nov. 17, 2016

(30) Foreign Application Priority Data

May 15, 2015 (IN) ............................ 2457/CHE/2015

(51) Int. Cl.
*G11C 7/06* (2006.01)
*G11C 17/08* (2006.01)
(52) U.S. Cl.
CPC .................................... *G11C 17/08* (2013.01)
(58) Field of Classification Search
CPC .. G11C 7/067; G11C 7/08; G11C 7/06; G11C 7/1072; G11C 7/126; G11C 7/12; G11C 7/10; G11C 2207/068; G11C 2207/2281
See application file for complete search history.

(56) References Cited

U.S. PATENT DOCUMENTS

| 4,982,363 | A | * | 1/1991 | Sood | ...................... | G11C 17/12 327/51 |
| 5,495,191 | A | * | 2/1996 | Lev | ........................ | G11C 7/067 327/51 |
| 5,748,015 | A | * | 5/1998 | Tam | ........................ | G11C 7/067 327/309 |
| 5,848,015 | A | | 12/1998 | Seno | | |

(Continued)

OTHER PUBLICATIONS

Heo, S. et al., "Dynamic Fine-Grain Leakage Reduction Using Leakage-Biased Bitlines," The 29th Annual Int'l Symposium for Computer Architecture (ISCA-29), May 2002, 11 pages.

(Continued)

*Primary Examiner* — Andrew Q Tran
(74) *Attorney, Agent, or Firm* — Fenwick & West LLP

(57) ABSTRACT

A circuit detects values stored in bit cells of a memory circuit, for example, a memory circuit with single ended sensing. The circuit injects a charge into a bit line coupled to a bit cell to detect the value stored in the bit cell. A level detector detects the voltage level of the bitline as the charge in injected in the bitline. The sensing circuit determines the bit value stored during the charge injection phase. If the bitline voltage reaches above a high threshold voltage level as the charge in injected in the bitline, the circuit determines that the bit cell stores a first bit value (for example, bit value 1.) If the bitline voltage stays below a low threshold voltage level as the charge in injected in the bitline, the circuit determines that the bit cell stores a second bit value (for example, bit value 0).

20 Claims, 9 Drawing Sheets

(56) References Cited

U.S. PATENT DOCUMENTS

| | | | |
|---|---|---|---|
| 5,880,999 | A | 3/1999 | Ansel et al. |
| 6,098,145 | A | 8/2000 | Huang |
| 7,295,481 | B2 | 11/2007 | Pille et al. |
| 7,301,819 | B2 | 11/2007 | Khanuja |
| 8,570,784 | B2 | 10/2013 | Liu |

OTHER PUBLICATIONS

Kim, S. et al., "Predictive Precharging for Bitlin Leakage Energy Reduction," 15$^{th}$ Annual IEEE International ASIC/SOC Conference, 2002, 5 pages.

\* cited by examiner

SENSING SCHEME FOR HIGH SPEED MEMORY CIRCUITS WITH SINGLE ENDED SENSING

CROSS REFERENCE TO RELATED APPLICATIONS

This application claims the benefit of Indian Provisional Patent application Ser. No. 2457/CHE/2015, filed May 15, 2015, which is incorporated by reference in its entirety.

BACKGROUND

1. Field of the Disclosure

The present disclosure relates to memory circuits in general and in particular to sensing schemes for memory circuits with single ended sensing.

2. Description of the Related Art

System on chip (SOC) designs are being increasingly used in consumer electronics market due to their low power consumption and high speed. A large portion of the chip area of an SOC is occupied by memory circuits. SOCs are increasingly using read only memories (ROM) to improve their power consumption and speed. For example, digital signal processors (DSP) implement fixed coefficients for mathematical processing such as digital transforms using ROMs.

Conventional ROM circuits perform bitline pre-charge and discharge operations. The voltage levels of the ROM cells are sensed after the discharge of the pre-charged bitline. Waiting for the bitline to discharge often contributes to large memory access time. Conventional memory circuits therefore have large memory access time, thereby slowing the performance of the SOC chips using the ROM. Furthermore, full precharge and discharge operations result in higher dynamic power dissipation in conventional memory circuits.

SUMMARY

Embodiments relate to detecting a value stored in a bit cell of a read only memory (ROM) circuit. Each bit cell of the ROM circuit is configured to store either a first bit value or a second bit value. The circuit injects a charge into a bitline coupled to the bit cell. A level detector determines the bit value stored in the bit cell based on the voltage level of the bit line during the injection of the charge into the bitline. If the voltage level of the bitline stays below a first threshold voltage level during the injection of the charge, the level detector determines that the bit value stored in the bit cell is the first bit value. If the voltage level of the bitline exceeds a second threshold voltage level higher than the first threshold voltage level during the injection of the charge, the level detector determines that the bit value stored in the bit cell is the second bit value.

In an embodiment, the level detector includes an inverter that receives the bit line voltage and a positive feedback circuit coupled to the output of the inverter. If the bit line voltage stays below the first threshold voltage level during the injection of the charge, the inverter generates an inverter output signal of a first level (high). The output of the inverter causes the positive feedback circuit to output a first voltage value indicating that the bit cell stores the first bit value.

Similarly, if the bit line voltage exceeds the second threshold voltage level during the injection of the charge, the inverter generates an inverter output signal of a second level different from the first level. The inverter output signal causes the positive feedback circuit to output a second voltage value indicating that the bit cell stores the second bit value.

In an embodiment, in the case in which the voltage level of the bitline stays below the first threshold voltage level during the injection of the charge, the voltage level of the bitline changes as follows. The voltage level of the bitline increases above a first voltage level that is lower than the first threshold voltage level. The voltage level of the bitline then decreases to a value equal to or less than the first voltage level after the injection of the charge into the bit line.

In an embodiment, in the case in which the voltage level of the bitline exceeds the second threshold voltage level during the injection of the charge, the voltage level of the bitline changes as follows. The voltage level of the bitline increases above a second voltage level that is higher than the second threshold voltage level. The voltage level of the bitline subsequently stays above the second voltage level after the injection of the charge into the bit line.

In an embodiment, the circuit injects the charge into the bit line by receiving a pre-charge signal (PRCH) as input to a pre-charger transistor. In response to the pre-charge signal, the pre-charger transistor causes the bitline to be coupled to a first reference voltage source (VDD) via the pre-charger transistor.

In an embodiment, the first threshold voltage level is less than a half of the voltage level of a first reference voltage source (VDD).

In an embodiment, the second threshold voltage level is greater than the half of the voltage level of the first reference voltage source.

In an embodiment, the ROM circuit includes a word line decoder. The word line decoder receives an address of a word of the ROM circuit. The word line decoder selects a word line corresponding to a plurality of the bit cells based on the address. The bit cells of the selected plurality of bit cells are sensed by the circuit.

In an embodiment, the word line decoder selects the word line by causing the word line voltage to switch from a first voltage to a second voltage higher than the first voltage during the injection of the charge into the bitline.

In an embodiment, the level detector detects the voltage level of the bitline responsive to receiving a level detector enable signal activated by a clock signal.

In an embodiment, the first bit value is false and the second bit value is true.

BRIEF DESCRIPTION OF THE DRAWINGS

The teachings of the embodiments can be readily understood by considering the following detailed description in conjunction with the accompanying drawings.

DETAILED DESCRIPTION

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Figure 1:
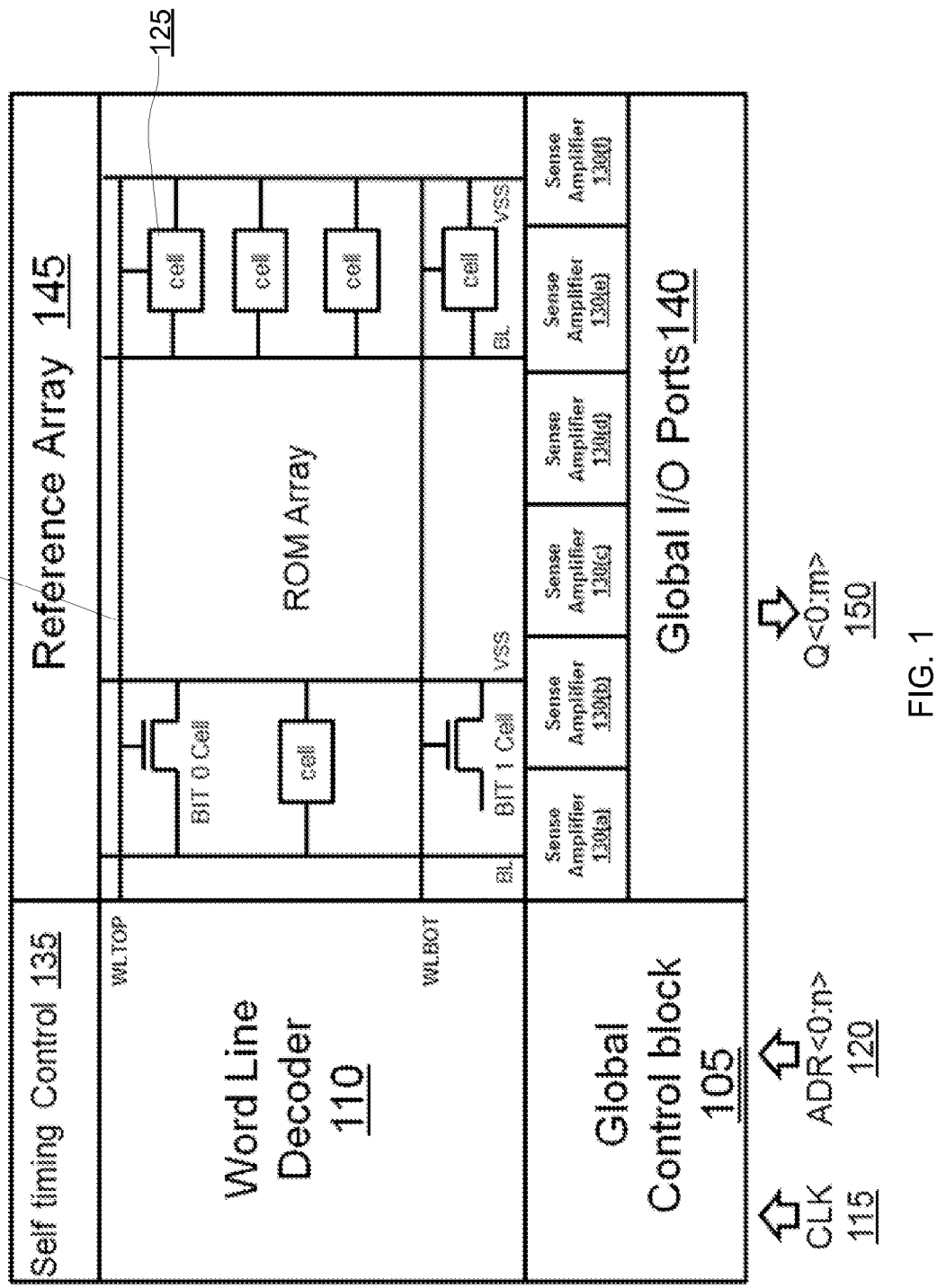
FIG. 1 shows the overall architecture of the read only memory (ROM) array, according to an embodiment.

FIG. 1 shows the overall architecture of the read only memory (ROM) array, according to an embodiment. A letter after a reference numeral, such as "130a," indicates that the text refers specifically to the element having that particular reference numeral. A reference numeral in the text without a following letter, such as "130," refers to any or all of the elements in the figures bearing that reference numeral (e.g. "130" in the text refers to reference numerals "130a" and/or "130b" in the figures).

The ROM circuit 100 shown in FIG. 1 comprises an array of cells 125. Each cell is configured to store a bit 0 value or a bit 1 value (a bit 0 value herein indicates a logical "false" value and a bit 1 value herein indicates a logical "true" value). The ROM circuit 100 receives an input clock 115 and an address 120 as input. The clock 115 controls timing for various operations of the ROM circuit 100. The address 120 identifies a specific word of the ROM circuit that needs to be read.

A global control block 105 latches the clock signal 115 and the address signals 120 received by the ROM circuit 100. The word line decoder 110 decodes the word address received from the global control block 105 to select a single word line. A set of bit cells 125 that form a word are connected to a word line 155. There are a plurality of word lines. FIG. 1 shows two of word lines WLTOP and WLBOT. The remaining word lines are assumed to be between these two word lines. The self timing control 135 generates internal clocks based on the clock signal 115 to control timing of the signals of various components of the ROM circuit 100.

The reference array 145 provides reference signal levels for comparing with the signal levels of selected bit cells. The reference signal can be a reference voltage, a reference current, a reference charge, or a reference time. The sense amplifiers (SAs) 130 detect the values stored in the bit cells at the addressed memory location in the read only memory. The global I/O ports 140 provide the output 150 of the memory circuit to any component reading the data stored in the read only memory based on the outputs of the sense amplifiers 130 to. Although, embodiments are described herein using ROM circuits, the techniques disclosed herein are applicable to any type of memory circuit with single ended sensing schemes.

Figure 2:
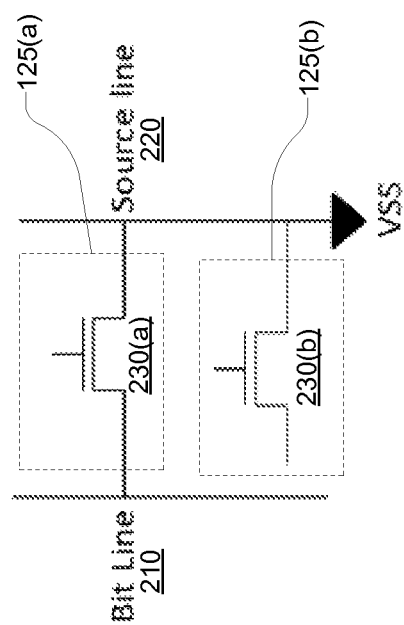
FIG. 2 is a circuit diagram illustrating a read only memory cell, according to an embodiment.

FIG. 2 shows a circuit diagram of read only memory cells 125, according to an embodiment. FIG. 2 shows two memory cells 125(a) and 125(b). The memory cell 125(a) is configured to store a bit value 0 and the memory cell 125(b) is configured to store a bit value 1. The ROM circuit can be considered as an array of rows and columns, where each row represents a word. As shown in FIG. 2, the ROM circuit 100 includes a bit line 210 and a source line 220 for every column of the ROM circuit 100. The source line 220 connects the bit cells 125 to the ground voltage VSS. The bit line 210 carries the signal of the memory cell 125 to the sense amplifiers 130 for detection of the value stored in the memory cells 125. The gates of the transistors 230(a) and 230(b) corresponding to memory cells 125(a) and 125(b) are connected to their respective word lines (not shown in FIG. 2.)

The bit cell 125(a) is an example memory cell configured to store bit value 0. The bit cell 125(a) is configured to connect the bitline 210 to the source line 220 via the transistor 230(a). If the bit cell 125(a) is selected by the word line decoder 110, and a charge is injected into the bitline 210, the transistor 230(a) causes the bitline to be discharged via the transistor 230(a).

The bit cell 125(b) is an example memory cell configured to store bit value 1. The cell 125(b) is configured such that the transistor 230(b) does not connect the bitline 210 to the source line 220. Accordingly, if the bit cell 125(b) is selected by the word line decoder, and a charge is injected into the bitline 210, the bitline 210 is not connected to the source line 220. Accordingly, the discharge of the bitline is slower compared to the situation where the bitline 210 is connected to the source line 220 via a transistor. This discharge is due to leakage and not due to the configuration of the selected cell. Accordingly, the voltage of the bitline as a result of injecting the charge is lower if the bit cell 125(a) is selected compared to the voltage if the bit cell 125(b) is selected.

Figure 3:
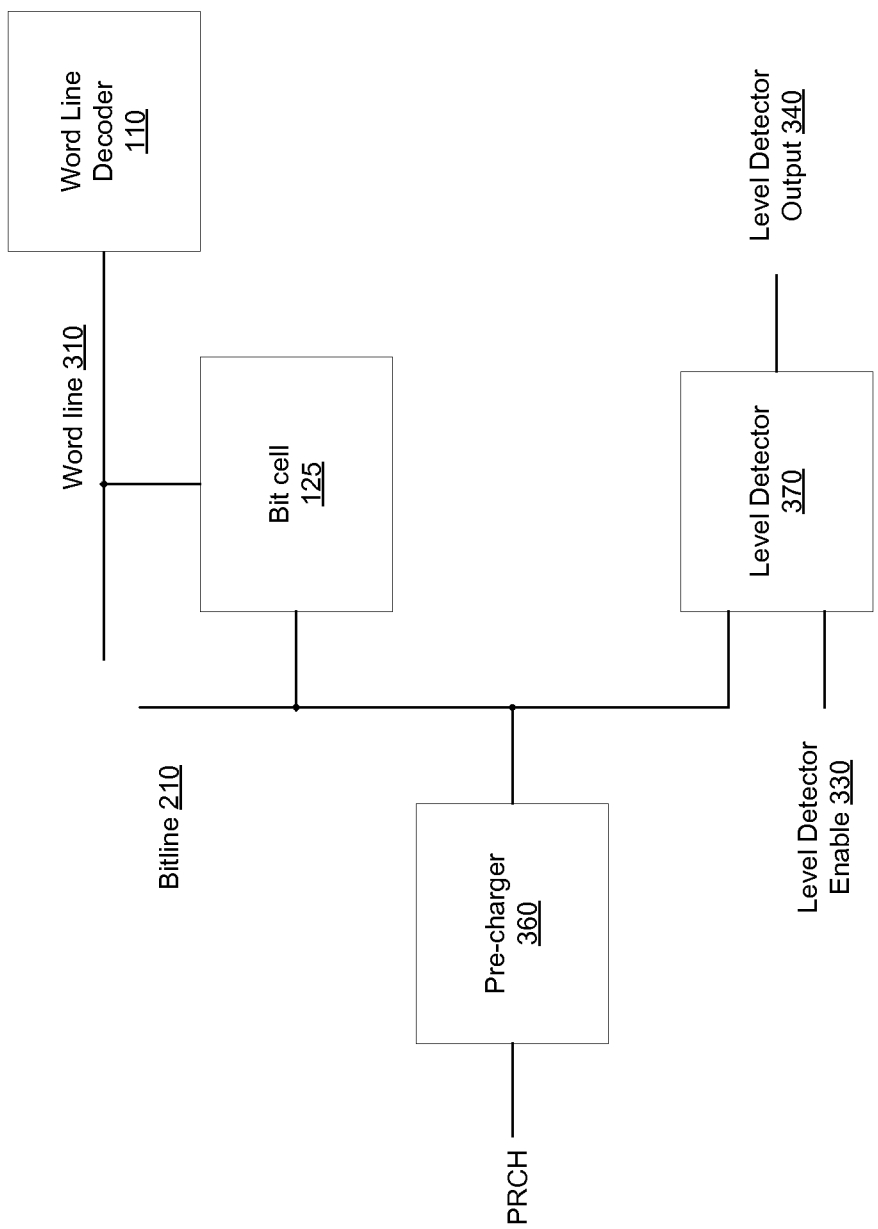
FIG. 3 is a circuit diagram illustrating components of a circuit for detecting the bit value stored in a ROM cell, according to an embodiment.

FIG. 3 shows components of a circuit for detecting the bit value stored in a ROM cell, according to an embodiment. The circuit shown in FIG. 3 comprises a bit cell 125 coupled to a pre-charger 360 via bitline 210. The bit cell 125 is coupled to the word line decoder 110 via word line 310. The word line decoder 110 selects a single word line 310 based on the address 120 input to the word line decoder 110, and thereby selects the bit cell 125.

The pre-charger 360 injects a charge into the bitline 210. In an embodiment, the pre-charger 360 comprises a transistor that receives PRCH signal as input. The PRCH signal may be generated by combining the internal clock (INT_CLK) with a column address signal. The PRCH signal causes the bitline 210 to be connected to a supply voltage VDD via the transistor of the pre-charger 360. As a result, the pre-charger 360 causes a charge to be injected into the bitline 210 from the supply voltage VDD via the transistor of the pre-charger 360. The injection of the charge into the bitline 210 causes the voltage of the bitline 210 to increase.

The voltage level reached by the bitline 210 as a result of the injection of the charge by the pre-charger 360 depends on the data value stored in the bit cell 125. For example, if the bit cell 125 stores a bit value 0, the bit cell 125 connects the bitline 210 to the ground voltage VSS via a transistor, as shown in FIG. 2. As a result, the bitline 210 discharges via the ground voltage as the charge in injected into the bitline by the pre-charger 360. This causes the voltage level reached by the bit line 210 to stay below a low threshold voltage level, as described below in detail with reference to FIG. 5. In an embodiment, the low threshold voltage level is a value less than half of the supply voltage VDD of the ROM circuit. For example, the low threshold voltage level may be 40% of the supply voltage of the ROM circuit.

If the bit cell 125 stores a bit value 1, the bit cell 125 does not connect the bitline 210 to the ground voltage VSS, as shown in FIG. 2. As a result, the voltage level reached by the bit line 210 exceeds a high threshold voltage level, as described below in detail with reference to FIG. 6. In an embodiment, the high threshold voltage level is a value greater than half of the supply voltage VDD of the ROM circuit. For example, the high threshold voltage level may be 60% of the supply voltage of the ROM circuit.

The level detector 370 detects the voltage level reached by the bitline 210 as a result of the pre-charge signal. The level detector 370 is enabled by a level detector enable signal 330 received from. In an embodiment, the level detector signal is programmable. If the memory circuit includes self-timing support, the level detector signal may be generated using an internal clock signal (INT_CLK). If the memory circuit does not include self-timing support the level detector input can be hardwired to be permanently enabled. Typically the level detector enable signal 330 causes the level detector 370 to be disabled to avoid the level detector from consuming power. The level detector enable signal 330 is turned active to enable the level detector when a word needs to be read from the ROM.

If the level detector 370 is enabled, the level detector 370 determines whether the voltage level of the bitline 210 is above the high threshold voltage level or below the low threshold voltage level. If the level detector 370 determines that the voltage level of the bit line 210 is above the high threshold voltage level, the level detector output 340 indicates that the selected bit cell 125 connected to the bitline stores a value 1. If the level detector 370 determines that the voltage level of the of the bitline 210 is below the low threshold voltage level, the level detector output 340 indicates that the selected bit cell 125 connected to the bitline 210 stores a value 0.

In general, a bit cell 125 can store one of two logical values, a first logical value or a second logical value. For example, the first logical value can be 0 and the second logical value can be 1. Alternatively, the first logical value can be 1 and the second logical value 0. If the level detector 370 determines that the voltage level of the bit line 210 is above the high threshold voltage level, the level detector output 340 indicates that the bit cell 125 connected to the bitline 210 stores the first logical value. If the level detector 370 determines that the voltage level of the of the bit line 210 is below the low threshold voltage level, the level detector output 340 indicates that the bit cell 125 connected to the bitline 210 stores the second logical value.

Figure 4:
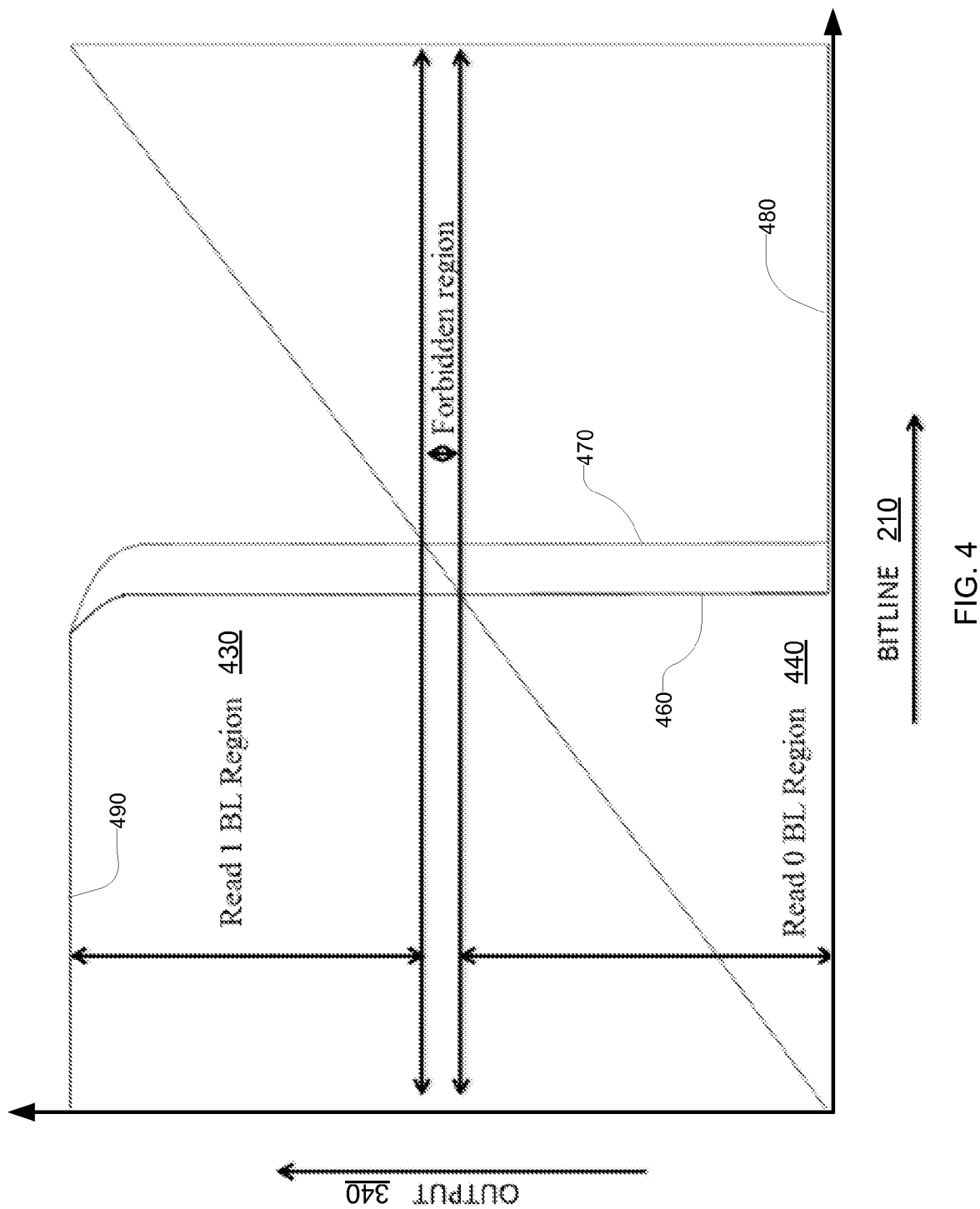
FIG. 4 is a graph illustrating the ranges of voltage output by the level detector based on the value stored in a bit cell, according to an embodiment.

FIG. 4 shows the ranges of voltage output by the level detector based on the value stored in a bit cell, according to an embodiment. FIG. 4 shows the voltage value of the bit line 210 along the X-axis and the level detector output 340 along the Y-axis. The voltage level 460 along the X-axis corresponds to the low threshold voltage level and the voltage level 470 corresponds to the high threshold level. As shown in FIG. 4, the level detector 370 inverts the output 340. Accordingly, if the bit line 210 pre-charge causes the bitline 210 to reach above the high threshold voltage level 470, the level detector output 340 indicates that the bit cell 125 stores a bit value one as shown by the low output voltage level 480 (since the level detector output is complement of the bit cell value.) Similarly, if the bit line 210 stays below the low threshold level 460 as a result of pre-charging, the level detector output 340 indicates that the bit cell 125 stores a bit value zero as indicated by the high output voltage level 490 since the level detector output is complement of the bit cell value.)

In alternative embodiments the circuits can be configured such that the bit line discharges when the bit cell stores a value one and the bitline does not discharge when the bit cell stores a value zero. In this configuration the level detector output matches the value of bit cell stored. For example, if the bit line 210 pre-charge causes the bitline 210 to reach above the high threshold voltage level 470, the level detector output 340 becomes low indicating that the bit cell 125 stores a bit value zero Similarly, if the bit line 210 stays below the low threshold level 460 as a result of pre-charging, the level detector output 340 stays high indicating that the bit cell 125 stores a bit value one.

FIG. 4 shows a range of bit line voltage values between 460 and 470 for which the level detector output 340 is undefined. The range of bit line voltage between 460 and 470 is referred to as a forbidden zone. The circuit elements of the components shown in FIG. 3 are designed to ensure that the bit line voltage value as a result of pre-charge stays outside the range between 460 and 470.

Figure 5:
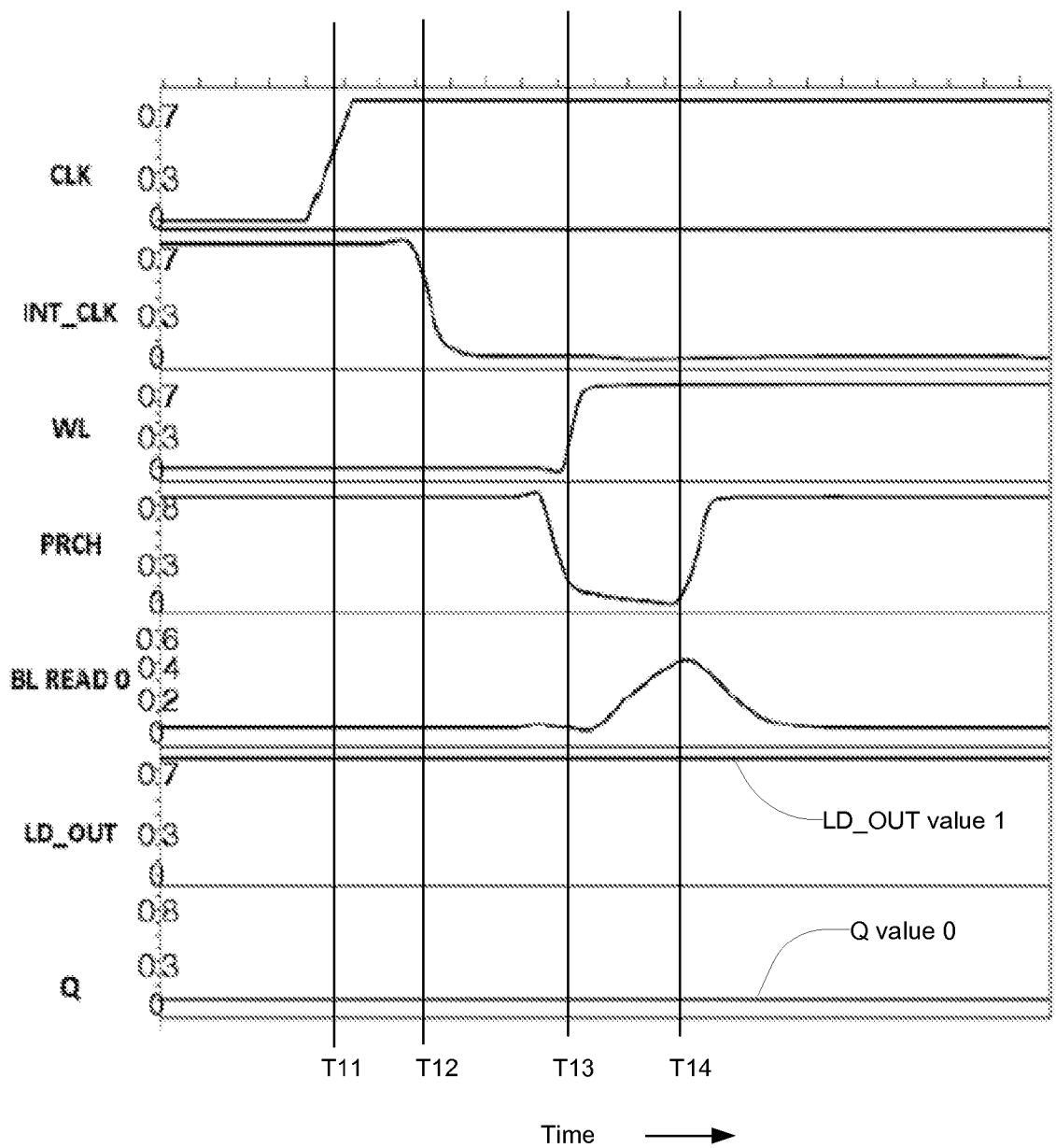
FIG. 5 is a timing diagram illustrating the signals at various nodes of the circuit when a bit value 0 is stored in a bit cell, according to an embodiment.

FIG. 5 illustrates the signal at various nodes of the circuit of a read only memory when a bit value 0 is stored in a bit cell, according to an embodiment. The X-axis of the charts shown in FIG. 5 shows time and the Y-axis shows the values of various signals. The signal levels and timings illustrated in FIG. 5 are exemplary and may vary from the values illustrated in the figure.

The CLK signal is a clock signal received by the ROM circuit 100 and is received via the input 115 shown in the circuit of FIG. 1. The CLK signal rises at time T11. The timing control 135 generates the INT_CLK signal based on the CLK signal. As shown in FIG. 5, the rising edge of the CLK signal at T11 triggers a falling edge of the INT_CLK signal at time T12 after time T11. The INT_CLK signal causes the word line decoder 110 to select a particular word line, thereby triggering the WL signal at time T13 after time T12. The high level of the WL signal causes a bit cell 125 coupled to the corresponding word line 310 to be selected for read. The INT_CLK signal also triggers the PRCH signal at time T13.

The PRCH signal is received as input of the pre-charger 360. The PRCH signal falls at time T13 and rises again at T14, thereby causing the pre-charger 360 to inject a charge in the bit line 210 during the interval between T13 and T14. The pre-charger 360 attempts to charge the bit line 210 while the bit cell 125 attempts to discharge the bit line 210 as a result of the bit value 0 stored in the bit cell 125. As a result, the signal of the bitline 210 corresponds to the BL READ 0 signal. As shown in FIG. 4, the BL READ 0 signal stays below the low threshold voltage level 450.

The level detector 370 detects the low value of the BL READ 0 signal of the bit line 210, and thereby generates the LD_OUT signal at the level detector output 340. The LD_OUT signal remains high value as a result of the BL READ 0 signal staying below the low threshold voltage level 460. The Q signal shown in FIG. 5 represents the output 150 of the ROM circuit 100 shown in FIG. 1. In an embodiment, the Q signal is generated by an inverter (not shown in FIG. 3) that receives input from the level detector output 340. The Q signal indicates a low value indicating that the bit cell 125 stores the bit value 0.

Figure 6:
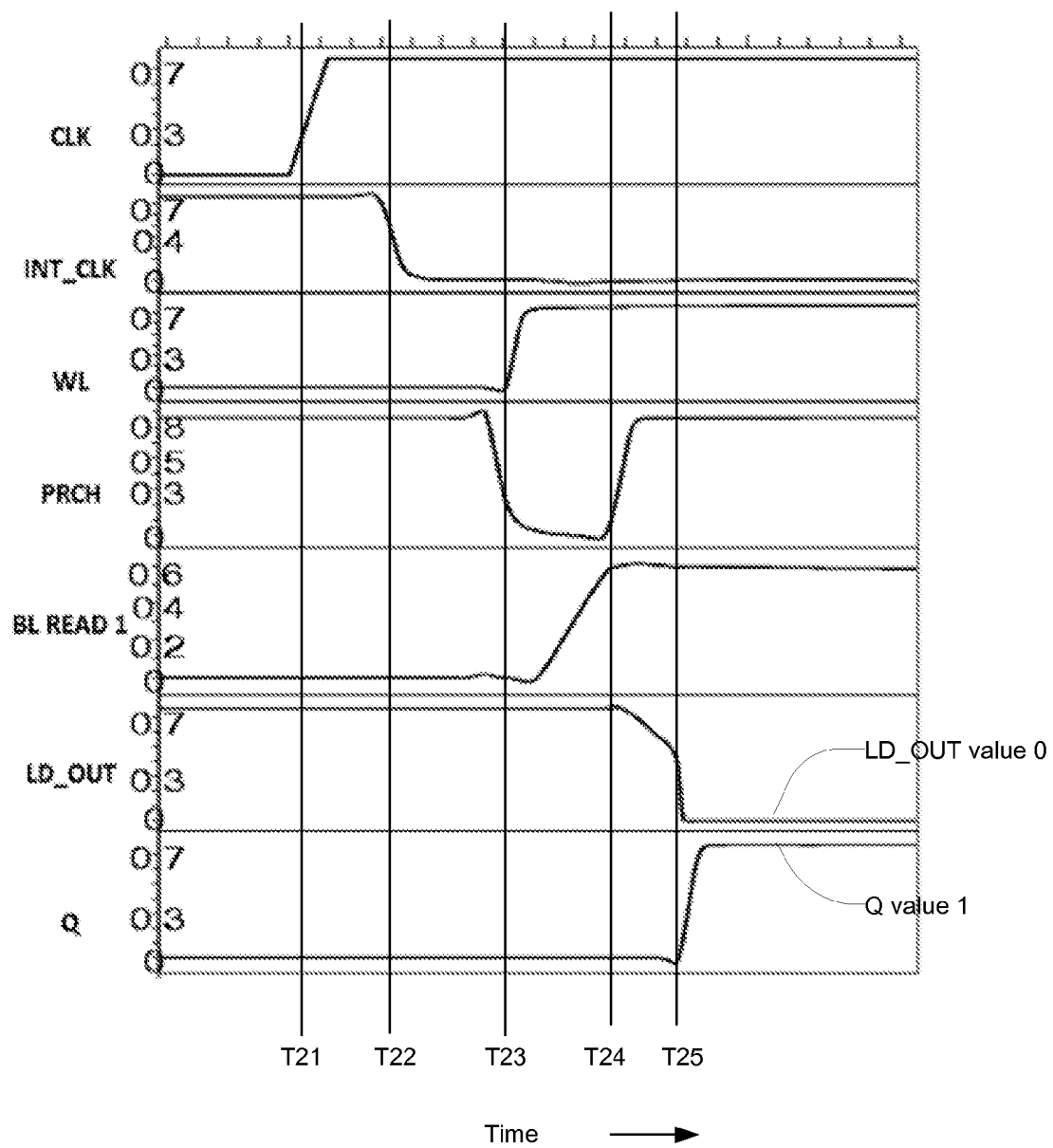
FIG. 6 is a timing diagram illustrating the signals at various nodes of the circuit when a bit value 1 is stored in a bit cell, according to an embodiment.

FIG. 6 illustrates the signal at various nodes of the circuit of a read only memory when a bit value 1 is stored in a bit cell, according to an embodiment. The X-axis of the charts shown in FIG. 6 shows time and the Y-axis shows the values of various signals. The signal levels and timings illustrated in FIG. 6 are exemplary and may vary from the values illustrated in the figure.

The CLK signal, the internal clock INT_CLK, the WL signal and the PRCH signal of FIG. 6 are similar to the corresponding signals described with respect to FIG. 5. The CLK signal rises at time T21. The CLK signal causes the INT_CLK signal to fall at time T22. The INT_CLK signal causes the WL signal to rise and the PRCH signal to fall at T23. The PRCH signal stays low between T23 and T24 and rises again at T24.

The PRCH signal causes the pre-charger 360 to pre-charge the bitline 210, and thereby generates the BL READ 1 signal. The value of the BL READ 1 signal is determined by the pre-charger 360 charging the bit line 210 to a high voltage value. As shown in FIG. 2, a bit cell that stores bit value 1 does not attempt to discharge the bit line 210. Accordingly, the BL READ 1 signal reaches above the high threshold voltage level 470 and stays high even after the pre-charger 360 stops injecting the charge into the bit line 210, for example, after T24.

The level detector 370 detects the high value of the BL READ 1 signal of the bit line 210, and thereby generates the LD_OUT signal at the level detector output 340. The LD_OUT signal becomes low at time T24 as a result of the BL READ 1 signal staying above the high threshold voltage level 470. The Q signal representing the output 150 of the ROM circuit 100 reaches a high value at time T25 indicating that the bit cell 125 stores the bit value 1.

The detection of the signal of the bitline is performed at the rising edge of the bitline signal as the bitline is charged rather than the falling edge of the bitline signal after completing charging of the bitline. The detection of the signal of the bit line during the rising edge of the bitline charging operation (i.e., during the injection of the charge in the bitline) allows for faster detection of the bit value stored in a bit cell compared to circuits that wait for the bitline to discharge after injecting the charge in the bitline. This is so because the process of discharging the bitline is a slow operation due to the bitline capacitance. Therefore, embodiments of the circuits detect the bit cell value fast for the case that the bit cell stores a 0 value. The circuits furthermore, do not wait for the bitline to charge fully (to the VDD value) and do not hold the charge at that value in the case that the bit cell stores 1. Accordingly, embodiments of the circuits detect the bit cell value fast for the case that the bit cell stores a 1 value.

Figure 7:
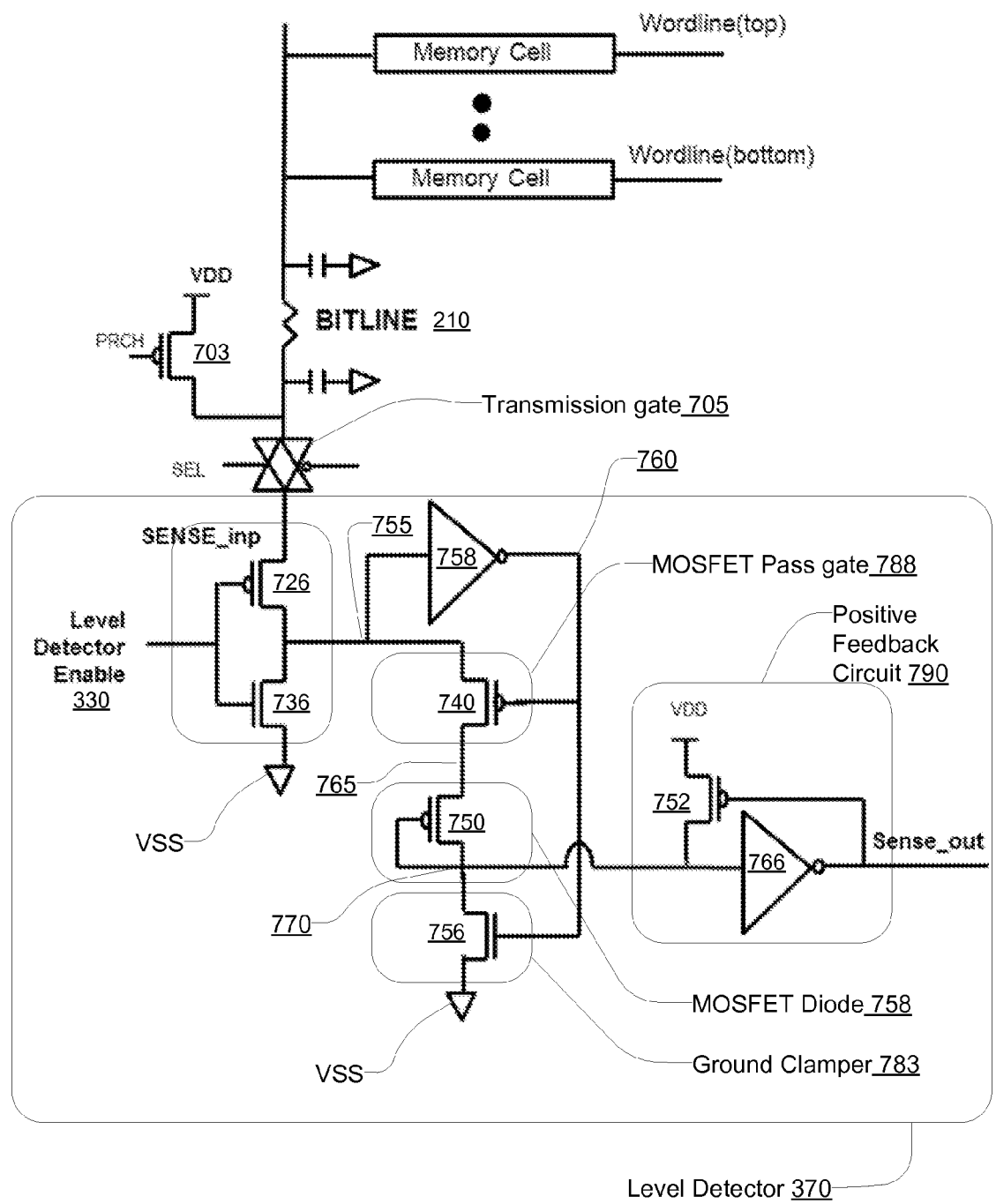
FIG. 7 is a circuit diagram illustrating a circuit for sensing the values stored in bit cells of a ROM circuit, according to an embodiment.

FIG. 7 shows the circuit for sensing the values stored in bit cells of a ROM circuit 100, according to an embodiment. The pre-charger 360 comprises a transistor 703 that receives the PRCH signal as input. The PRCH signal, when low, causes the transistor 703 to conduct, thereby causing the supply voltage VDD to inject charge into the bitline 210. The bitline is connected to a bit cell (not shown in FIG. 7). The voltage of the bitline changes as shown in the BL READ 0 signal of FIG. 6 if the bit cell being read stores a 0 bit value and as the BL READ 1 signal if FIG. 6 if the bit cell being read stores a 1 bit value.

The transmission gate 705 determines whether to pass the bitline signal to the level detector 370 based on the selector input SEL and the level detector enable signal. The level detector 370 is enabled when the level detector enable 330 is low. If the level detector enable 330 is high, the transistor 736 conducts, thereby causing node 755 to be connected to the ground voltage VSS. As a result, the node 755 has a low voltage level independent of the bitline signal over the bit line 210, thereby disabling the level detection operation of the level detector 370. If the level detector enable input 330 is low, the transistor 726 conducts instead of transistor 736, thereby allowing the bitline signal 726 to pass to the node 755. In this configuration, the level detector output 340 depends on the bitline signal and accordingly indicates the bit value stored in the bit cell connected to the bit line 210.

The level detector 370 further comprises an inverter 758 that receives the signal at the node 755. The output of the inverter 758 represented by node 760 is connected to a gate of the transistor 740 that acts as MOSFET pass gate 788. If the output of the inverter 758 is low, the MOSFET pass gate 788 passes the signal of node 755 to node 765. The level detector 370 further comprises a transistor 750 that is configured as a MOSFET diode 750 and a transistor 756 configured as a ground clamper 783. The signal at note 755 is connected via the MOSFET pass gate 788 to the MOSFET diode 750 via node 765.

If the node 765 is above the threshold voltage of the MOSFET diode 750, the MOSFET diode 750 conducts and passes the signal of the node 765 to the node 770. If the node 765 is below the threshold voltage of the MOSFET diode 750, the MOSFET diode 750 does not allow the signal of node 765 to pass through to the node 770.

The output of the inverter 758 is also connected to the input of the MOSFET ground clamper 783 via node 760. Accordingly, if the voltage of node 760 is high, the MOSFET ground clamper 783 is activated. If the MOSFET ground clamper 783 is activated, the MOSFET ground clamper 783 reduces the voltage of the node 770 by connecting node 770 to the ground voltage VSS.

The level detector 370 further includes a positive feedback circuit 790 formed by an inverter 766 and transistor 752 providing feedback from the output of the inverter 766 to the input of the inverter 766. Specifically, the output of the inverter 766 is connected to a gate of the transistor 752, which is a PMOS. The drain of the transistor 752 is connected to the input of the inverter 766 while the source of the transistor 752 is connected to the supply voltage VDD. The input of the positive feedback circuit 790 is connected to the MOSFET diode 750 and the ground clamper 783 via node 770. The inverter 766 inverts the input signal of node 770 and provides the inverted signal as the level detector output 340.

The following description tracks the signal through the circuit illustrated in FIG. 7 for signal received from the bit line 210 connected to a bit cell that stores bit value 1. If the signal at the bit line 210 is high and the transmission gate 705 is enabled by the level detector enable 330, the high voltage of the bit line 210 passes to the output 755 of the transmission gate 705. The high voltage at the node 755 causes the signal of the node 760 to be turned low by the inverter 758. The low signal at node 760 enables the MOSFET pass gate 788 to pass the high signal of node 755 to the node 765. The high signal at node 765 is above the threshold of the MOSFET diode 750, thereby causing the MOSFET diode 750 to conduct. Since the MOSFET diode 750 is conducting, the high signal of node 765 results in the signal of node 770 to be high. The high signal of node 770 is inverted by the inverter 766, thereby providing a low signal at the level detector output 340. The low output of the level detector 370 indicates that the voltage of the bit line 210 is high, thereby indicating that the bit cell 125 stores a bit value 1 (or true). In an embodiment, an inverter is further used to invert the level detector output 340 to generate the signal Q corresponding to the output 150 of the ROM circuit as shown in FIG. 1.

The following description tracks the signal through the circuit illustrated in FIG. 7 for signal received from the bit line 210 connected to a bit cell 120 storing a bit value 0. If the signal at the bit line 210 is low and the transmission gate 705 is enabled by the selector signal SEL, the low voltage of the bit line 210 is passed via the transmission gate 705 to the node 755 via the transistor 726. The low voltage at the node 755 causes the signal of the node 760 to be turned high by inverter 758. The high signal at node 760 enables the MOSFET ground clamper 730 to be enabled, thereby pulling the voltage of the node 770 low by connecting node 770 to the ground voltage VSS via the transistor 756. The low signal of node 770 is inverted by the inverter 766, thereby providing a high signal at the level detector output 340. The high value of the level detector output 340 indicates that the bit cell 125 stores a bit value 0 (or false). In an embodiment, an inverter is further used to invert the level detector output 340 to generate the signal Q corresponding to the output 150 of the ROM circuit as shown in FIG. 1.

The circuit shown in FIG. 7 shows one embodiment of the level detector 370. Other embodiments can use other types of level detectors, for example, an operational amplifier (or an op-amp).

Figure 8:
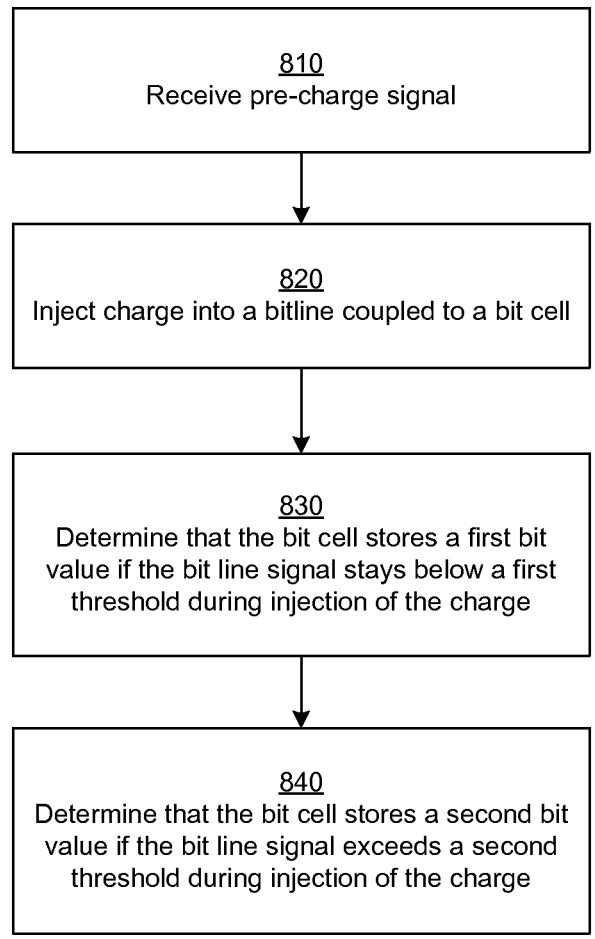
FIG. 8 is a flowchart illustrating the process of determining the value stored in a bit cell based on the bit line signal, in accordance with an embodiment.

FIG. 8 shows a flowchart illustrating the process of determining the value stored in a bit cell 125 based on the bit line signal corresponding to the bit cell, in accordance with an embodiment. The pre-charger 360 receives 810 the pre-charge signal indicated as PRCH in FIG. 3. The pre-charger 360 injects 820 a charge in a bit line 210 coupled to the bit cell 125 in response to the pre-charge signal. The signal of the bit-line 210 as a result of injection of the charge in the bit line 210 depends on the value stored in the bit cell 125.

The level detector 370 receives the bit line signal and determines the bit value stored in the bit cell 125 based on the bit line signal. If the level detector 370 determines that the voltage level of the bit line signal stays below the first threshold voltage level 460 at the rising edge of the bit line signal, the level detector 370 determines 830 that the bit value stored in the bit cell 125 is a first logical value (for example, bit value 0). If the level detector 370 determines that the voltage level of the bit line signal exceeds the second threshold voltage level 470 during injection of the charge, the level detector 370 indicates that the bit value stored in the bit cell 125 is a second logical value (for example, bit value 1).

The steps indicated in FIG. 8 may be performed in an order different from that indicated in FIG. 8. For example, steps 830 and 840 may be performed in parallel or step 840 may be performed before step 830.

Figure 9:
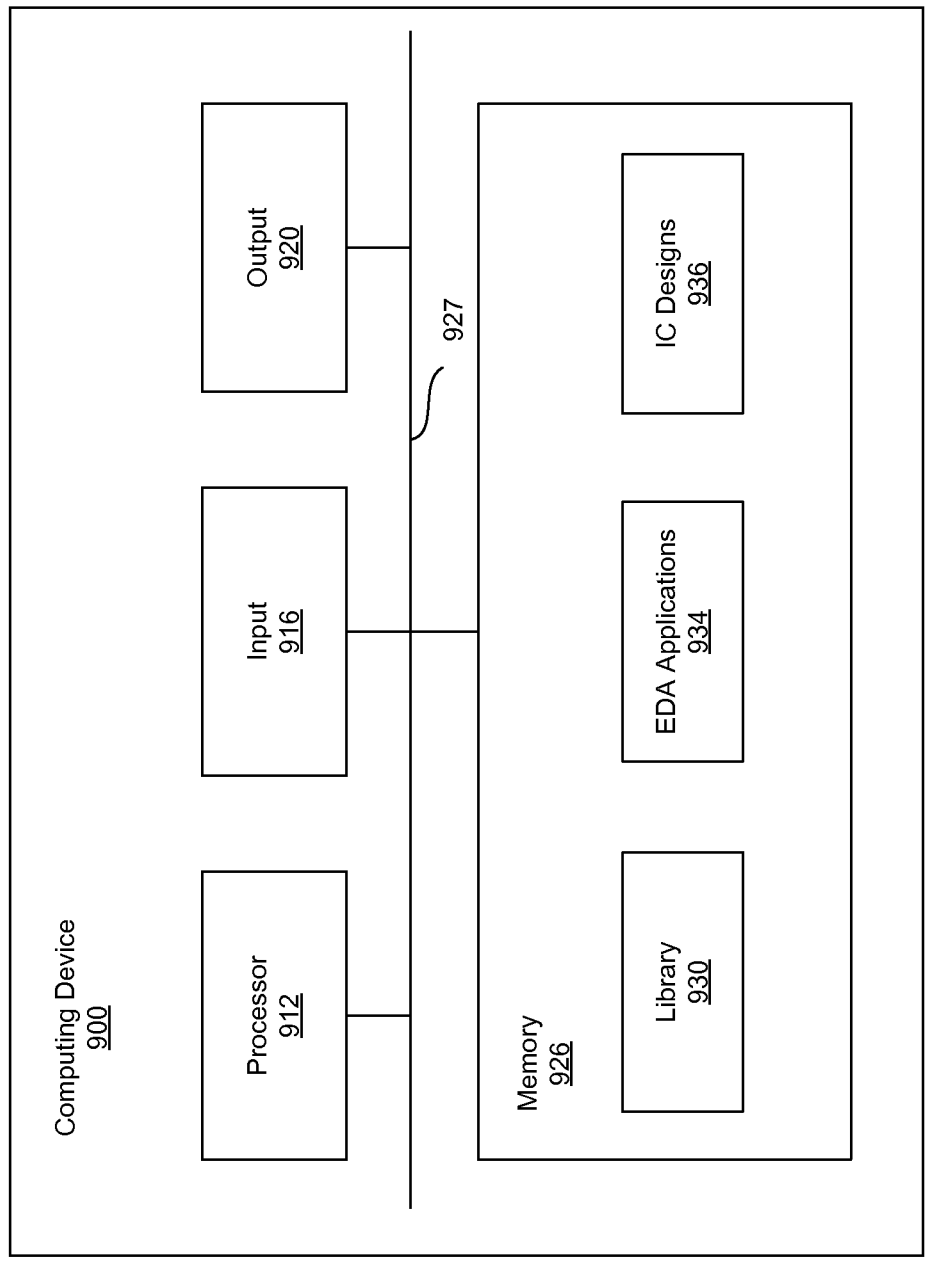
FIG. 9 is a block diagram of a computing device for performing designing operations associated with an integrated circuit, for example, an integrated circuit for the ROM circuit.

FIG. 9 is a block diagram of a computing device 900 for performing designing operations associated with an integrated circuit, for example, to generate a circuit design for integrated circuit for the ROM as described herein. The computer device 900 may include, among other components, a processor 912, an input module 916, an output module 920, a memory 926 and a bus for connecting these components. The processor 912 executes instructions stored in the memory 926. The input module 916 may include various devices for receiving user input, including keyboards and pointing devices (e.g., mouse and touch screen). The output module 920 includes a display device or interface device for communicating with the display device.

The memory 926 is a non-transitory computer readable storage medium storing, among others, library 930, electronic design automation (EDA) applications 934 and integrated circuit (IC) designs 936. The library 930 may include data on various circuit components, including instances of write assist circuits describe herein. The EDA applications 934 may include various software programs for designing ICs, including place and route tools, synthesis tools, and verification tools. The design processed by the EDA applications 934 may be stored in IC designs 936. The IC designs 936 may be an entire operational circuit or a part of a larger IC circuit.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A method of detecting a value stored in a bit cell of a read only memory (ROM) array, comprising:
   receiving a pre-charge signal to inject charge into a bitline coupled to the bit cell of a plurality of bit cells connected to a word line, each bit cell configured to store one of a first bit value or a second bit value;
   responsive to detecting by a level detector that a voltage level of the bitline stays below a first threshold voltage level during the injection of the charge into the bitline, generating an inverter output signal at an output of an inverter based on the voltage level of the bitline received at an input of the inverter to cause a positive feedback circuit to output a first voltage value indicating that the bit cell stores the first bit value; and
   responsive to detecting by the level detector that the voltage level of the bitline exceeds a second threshold voltage level higher than the first threshold voltage level during the injection of the charge into the bitline, determining that the bit cell stores the second bit value;
   wherein the voltage level of the bitline increases above a first voltage level during the injection of the charge into the bitline responsive to the voltage level of the bitline staying below the first threshold voltage level during the injection of the charge into the bitline, the first voltage level lower than the first threshold voltage level; and the voltage level of the bitline decreases below the first voltage level after the injection of the charge into the bitline responsive to the voltage level of the bitline staying below the first threshold voltage level during the injection of the charge into the bitline.

2. The method of claim 1, further comprising responsive to the voltage level of the bitline exceeding the second threshold voltage level during the injection of the charge into the bitline, generating the inverter output signal at the output of the inverter based on the voltage level of the bitline received at the input of the inverter to cause the positive feedback circuit to output a second voltage value indicating that the bit cell stores the second bit value.

3. The method of claim 1, further comprising:
   receiving, by a word line decoder, an address of a word of the ROM array; and selecting, by the word line decoder, the word line connected to the plurality of bit cells from a plurality of word lines, the word line selected based on the address.

4. The method of claim 3, wherein the word line decoder selects the word line by causing a voltage of the word line to switch from a first voltage to a second voltage during the injection of the charge into the bitline, wherein the second voltage is higher than the first voltage.

5. The method of claim 1, wherein (i) the voltage level of the bitline increases above the first voltage level during the injection of the charge into the bitline responsive to the voltage level of the bitline exceeding the second threshold voltage level, higher than the first threshold voltage level during the injection of the charge into the bitline, the first voltage level being above the second threshold voltage level; and (ii) the voltage level of the bitline stays above the first voltage level after the injection of the charge into the bitline responsive to the voltage level of the bitline exceeding the second threshold voltage level, higher than the first threshold voltage level during the injection of the charge into the bitline.

6. The method of claim 1, wherein the injection of the charge into the bitline comprises:
switching on a pre-charger transistor by the pre-charge signal; and
responsive to switching on the pre-charger transistor, coupling the bitline to a first reference voltage source via the pre-charger transistor.

7. The method of claim 1, wherein the first threshold voltage level is less than a half of a voltage level of a first reference voltage source.

8. The method of claim 7, wherein the second threshold voltage level is greater than the half of the voltage level of the first reference voltage source.

9. The method of claim 1, wherein detecting the voltage level of the bitline by the level detector is performed responsive to receiving a level detector enable signal activated by a clock signal.

10. The method of claim 1, wherein the first bit value is false and the second bit value is true.

11. A circuit, comprising:
a plurality of bit cells connected to a word line, each bit cell configured to store one of a first bit value or a second bit value, the plurality of bit cells comprising a bit cell coupled to a bitline;
a pre-charger transistor coupled to the bitline, the pre-charger transistor configured to inject charge into the bitline; and
a level detector receiving an input from the bitline, the level detector configured to output a first voltage level indicating that the bit value stored in the bit cell is the first bit value, responsive to a voltage level of the bitline staying below a first threshold voltage level during the injection of the charge into the bitline and output a second voltage level indicating that the bit value stored in the bit cell is the second bit value, responsive to the voltage level of the bitline exceeding a second threshold voltage level higher than the first threshold voltage level during the injection of the charge into the bitline, the level detector comprising:
a first inverter coupled to the bitline, the first inverter receiving the voltage level of the bitline;
a diode coupled to the output of the first inverter, the diode configured to conduct responsive to the voltage level of the bitline exceeding the second threshold voltage level during the injection of the charge into the bitline;
a first node connected to a first supply voltage via the diode responsive to the diode conducting; and
a positive feedback circuit receiving input from the first node, the positive feedback circuit outputting the first voltage level responsive to the first node connecting to the first supply voltage via the diode.

12. The circuit of claim 11, further comprising:
a ground clamper coupled to the output of the first inverter, the ground clamper being enabled responsive to the voltage level of the bitline staying below the first threshold voltage level during the injection of the charge into the bitline;
the first node connected to a ground voltage via the ground clamper responsive to the ground clamper being enabled; and
the positive feedback circuit further configured to output a second voltage level responsive to the first node connecting to the ground voltage via the ground clamper.

13. The circuit of claim 11, further comprising:
a word line decoder configured to receive an address of a word and select the word line from a plurality of word lines, the word line corresponding to the address.

14. The circuit of claim 13, wherein the word line decoder is configured to select the word line by causing a voltage of the word line to switch from a first voltage to a second voltage during the injection of the charge into the bitline, the second voltage higher than the first voltage.

15. The circuit of claim 11, wherein the pre-charger transistor is coupled to the first supply voltage and the bitline, the pre-charger transistor enabled by a pre-charge signal, the enabled pre-charger transistor configured to couple the bitline to the first supply voltage via the pre-charger transistor.

16. The circuit of claim 11, wherein the level detector configured to receive a level detector enable signal activated by a clock signal, the level detector configured to detect the voltage level of the bitline responsive to receiving the level detector enable signal.

17. The circuit of claim 11, wherein the level detector is an operational amplifier.

18. A non-transitory computer readable storage medium storing a digital representation of a circuit, the circuit comprising:
a plurality of bit cells connected to a word line, each bit cell configured to store one of a first bit value or a second bit value, the plurality of bit cells comprising a bit cell coupled to a bitline;
a pre-charger transistor coupled to the bitline, the pre-charger transistor configured to inject charge into the bitline; and
a level detector receiving an input from the bitline, the level detector configured to output a first voltage level indicating that the bit value stored in the bit cell is the first bit value, responsive to a voltage level of the bitline staying below a first threshold voltage level during the injection of the charge into the bitline and output a second voltage level indicating that the bit value stored in the bit cell is the second bit value, responsive to the voltage level of the bitline exceeding a second threshold voltage level higher than the first threshold volatage level during the injection of the charge into the bitline, the level detector comprising:
a first inverter coupled to the bitline, the first inverter receiving the voltage level of the bitline;
a diode coupled to the output of the first inverter, the diode configured to conduct responsive to the voltage level of the bitline exceeding the second threshold voltage level during the injection of the charge into the bitline;
a first node connected to a first supply voltage via the diode responsive to the diode conducting; and
a positive feedback circuit receiving input from the first node, the positive feedback circuit outputting the first voltage level responsive to the first node connecting to the first supply voltage via the diode.

19. The non-transitory computer readable storage medium of claim 18, wherein the pre-charger transistor is coupled to the first supply voltage and the bitline, the pre-charger transistor enabled by a pre-charge signal, the enabled pre-charger transistor configured to couple the bitline to the first supply voltage via the pre-charger transistor.

20. The non-transitory computer readable storage medium of claim 18, wherein the level detector configured to receive a level detector enable signal activated by a clock signal, the level detector configured to detect the voltage level of the bitline responsive to receiving the level detector enable signal.

* * * * *